(12) United States Patent
Chen et al.

(10) Patent No.: US 11,721,644 B2
(45) Date of Patent: Aug. 8, 2023

(54) SEMICONDUCTOR PACKAGE WITH RIVETING STRUCTURE BETWEEN TWO RINGS AND METHOD FOR FORMING THE SAME

(71) Applicant: Taiwan Semiconductor Manufacturing Co., Ltd., Hsinchu (TW)

(72) Inventors: Chien Hung Chen, Taipei (TW); Shu-Shen Yeh, Taoyuan (TW); Po-Chen Lai, Hsinchu (TW); Po-Yao Lin, Zhudong Township (TW); Shin-Puu Jeng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 68 days.

(21) Appl. No.: 17/372,694

(22) Filed: Jul. 12, 2021

(65) Prior Publication Data
US 2022/0352090 A1 Nov. 3, 2022

Related U.S. Application Data

(60) Provisional application No. 63/183,125, filed on May 3, 2021.

(51) Int. Cl.
*H01L 23/16* (2006.01)
*H01L 23/00* (2006.01)
(Continued)

(52) U.S. Cl.
CPC ........ *H01L 23/562* (2013.01); *H01L 21/4853* (2013.01); *H01L 21/563* (2013.01);
(Continued)

(58) Field of Classification Search
CPC .................................................... H01L 23/562
See application file for complete search history.

(56) References Cited

U.S. PATENT DOCUMENTS

| 6,218,730 | B1 | 4/2001 | Toy et al. |
| 10,764,996 | B1 * | 9/2020 | Boja ................... H05K 1/0271 |

(Continued)

FOREIGN PATENT DOCUMENTS

WO 2020180179 A1 9/2020

*Primary Examiner* — Selim U Ahmed
*Assistant Examiner* — Evan G Clinton
(74) *Attorney, Agent, or Firm* — Slater Matsil, LLP

(57) ABSTRACT

A semiconductor package and a method of forming the same are provided. The semiconductor package includes a package substrate and a semiconductor device mounted on the surface of the package substrate. A first ring is disposed over the surface of the package substrate and surrounds the semiconductor device. A second ring is disposed over the top surface of the first ring. Also, a protruding part and a matching recessed part are formed on the top surface of the first ring and the bottom surface of the second ring, respectively. The protruding part extends into and engages with the recessed part to connect the first ring and the second ring. An adhesive layer is disposed between the surface of the package substrate and the bottom surface of the first ring for attaching the first ring and the overlying second ring to the package substrate.

20 Claims, 14 Drawing Sheets

(51) Int. Cl.
*H01L 23/31* (2006.01)
*H01L 23/58* (2006.01)
*H01L 21/56* (2006.01)
*H01L 21/48* (2006.01)

(52) U.S. Cl.
CPC .......... *H01L 23/16* (2013.01); *H01L 23/3185* (2013.01); *H01L 23/585* (2013.01); *H01L 24/16* (2013.01); H01L 2224/16227 (2013.01); H01L 2924/18161 (2013.01); H01L 2924/3511 (2013.01); H01L 2924/35121 (2013.01)

(56) References Cited

U.S. PATENT DOCUMENTS

| | | |
|---|---|---|
| 2005/0056926 A1* | 3/2005 | Chen ........................ H01L 23/10 257/E23.101 |
| 2018/0261528 A1 | 9/2018 | Chen et al. |
| 2019/0172767 A1* | 6/2019 | Kwon .................... H01L 23/24 |

* cited by examiner

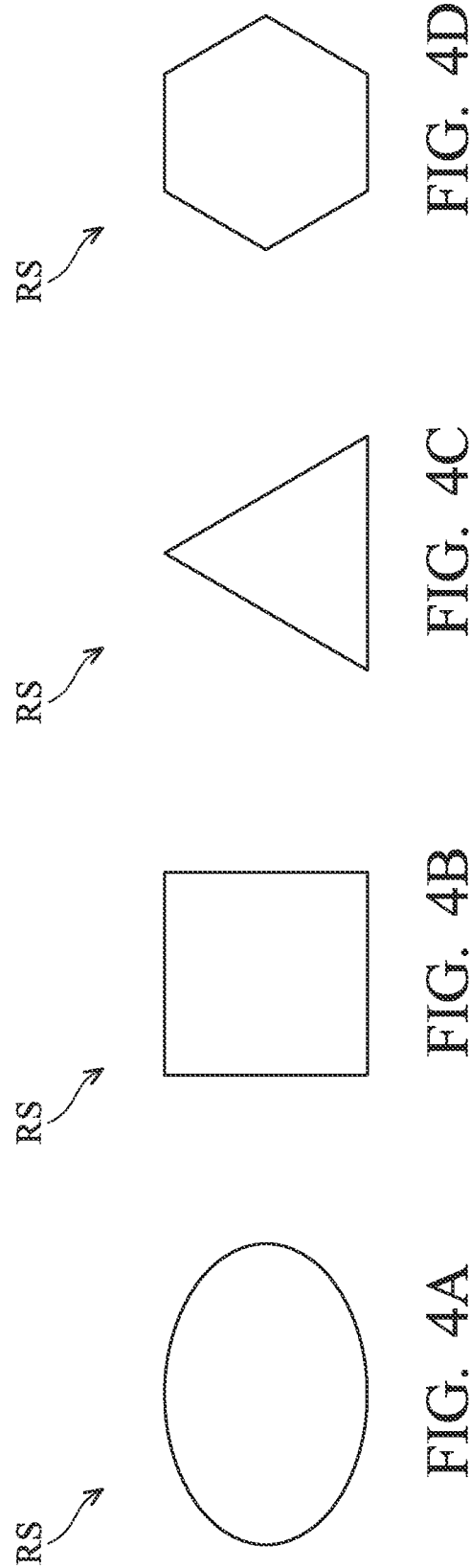

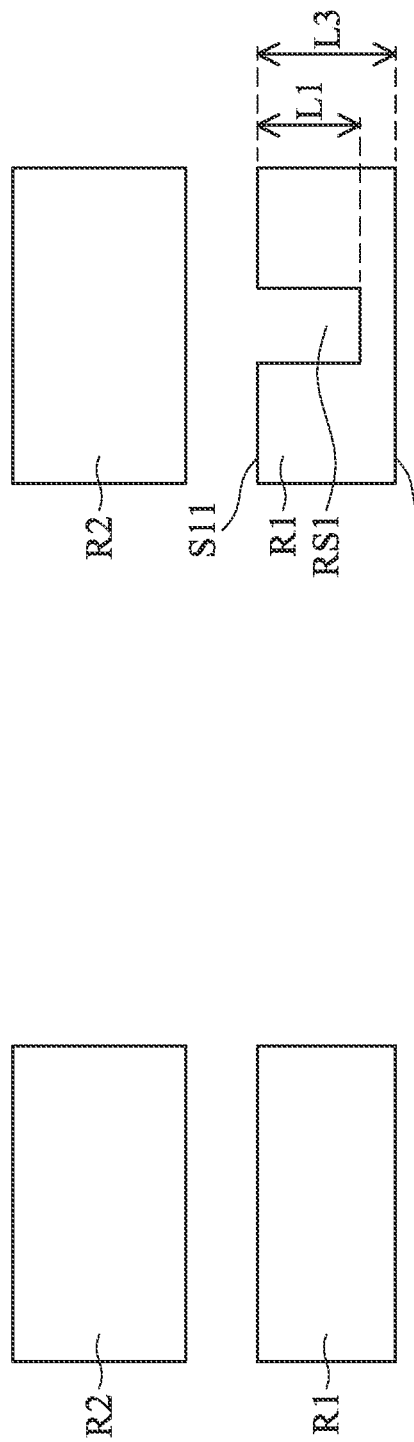

SEMICONDUCTOR PACKAGE WITH RIVETING STRUCTURE BETWEEN TWO RINGS AND METHOD FOR FORMING THE SAME

CROSS REFERENCE TO RELATED APPLICATIONS

This application claims priority of U.S. Provisional Patent Application No. 63/183,125, filed on May 3, 2021, the entirety of which is incorporated by reference herein.

BACKGROUND

Semiconductor devices are used in a variety of electronic applications, such as personal computers, cell phones, digital cameras, and other electronic equipment. Semiconductor devices are fabricated by sequentially depositing insulating or dielectric layers, conductive layers, and semiconductor layers over a semiconductor substrate, and patterning the various material layers using lithography and etching processes to form circuit components and elements thereon. Many integrated circuits (ICs) are typically manufactured on a single semiconductor wafer, and individual dies on the wafer are singulated by sawing between the integrated circuits along a scribe line. The individual dies are typically packaged separately, in multi-chip modules, for example, or in other types of packaging.

A package not only provides protection for semiconductor devices from environmental contaminants, but also provides a connection interface for the semiconductor devices packaged therein. Smaller package structures, which take up less area or are lower in height, have been developed to package the semiconductor devices.

Although existing packaging structures and methods for fabricating semiconductor package structure have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 4A, 4B, 4C, and 4D illustrate riveting structures with various horizontal cross-sectional shapes in accordance with some other embodiments.

FIGS. 5A-5C illustrate cross-sectional views of various intermediate stages of the formation of the riveting structure and the assembly of the two rings shown in FIG. 2 or 3, in accordance with some other embodiments.

DETAILED DESCRIPTION

Figure 1:
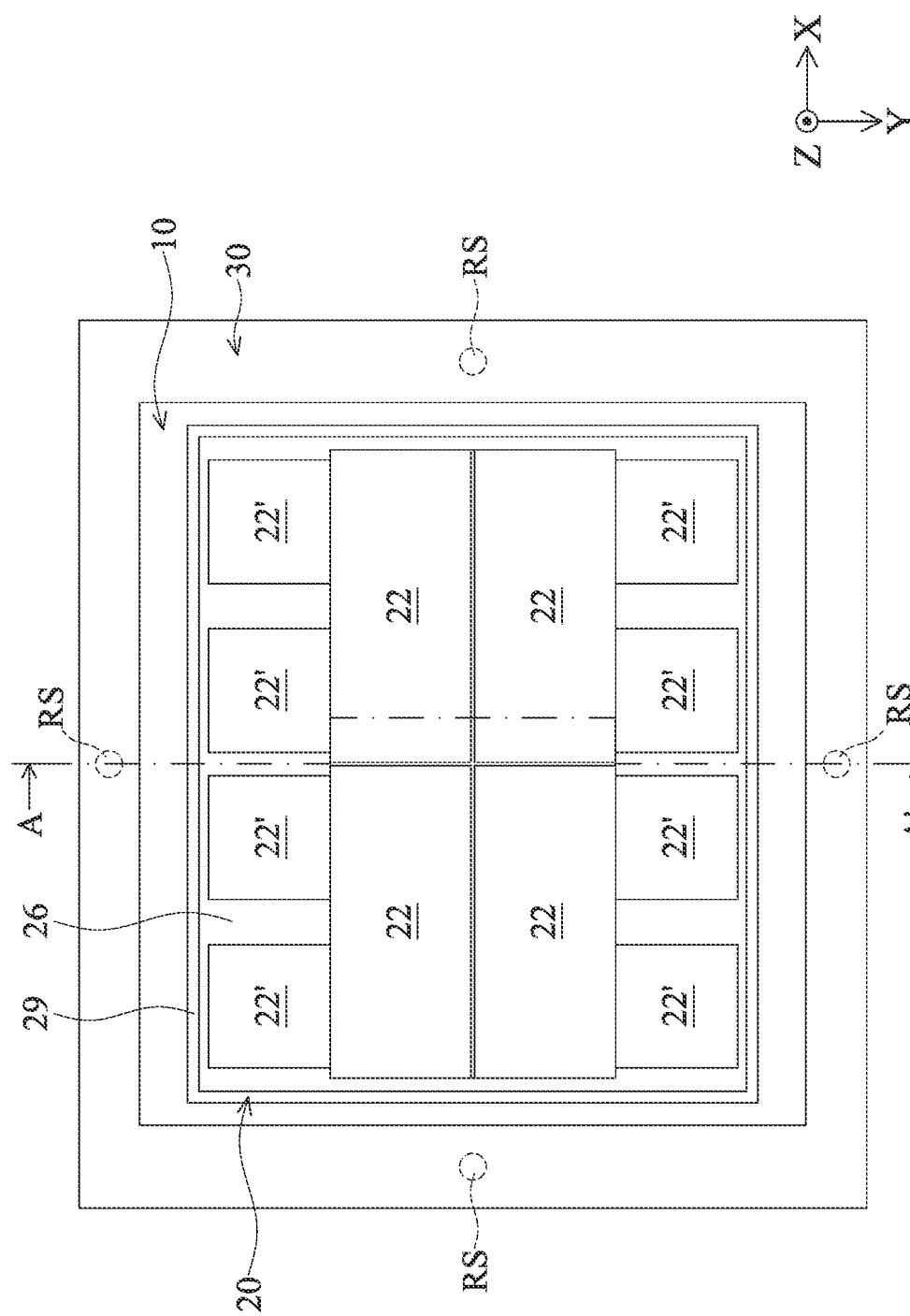
FIG. 1 is a schematic top view of a semiconductor package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

A semiconductor package and the method for forming the same are provided in accordance with various embodiments. Some variations of some embodiments are discussed. Throughout the various views and illustrative embodiments, like reference numbers are used to designate like elements. In accordance with some embodiments of the present disclosure, a semiconductor package includes a lower ring and an upper ring, which are connected using riveting structures formed between the rings (rather than an additional adhesive). Each riveting structure includes a protruding part and a matching recessed part formed on adjacent surfaces of the rings, respectively. The use of riveting structures prevents delamination of the adhesive layer between the rings during thermal cycling. Moreover, by arranging the riveting structures to correspond to the high stress areas in the semiconductor package, it helps to relieve the stress in the package (which will be described further below), thereby improving the reliability of the entire package. Further, since the rings can be directly connected through the riveting structures (the supply of adhesive for connecting the rings is omitted), the manufacturing process of the semiconductor package can also be simplified.

Embodiments will be described with respect to a specific context, namely a packaging technique with an interposer substrate or other active chip in a two and a half dimensional integrated circuit (2.5DIC) structure or a three dimensional IC (3DIC) structure. Embodiments discussed herein are to provide examples to enable making or using the subject matter of this disclosure, and a person having ordinary skill in the art will readily understand modifications that can be made while remaining within contemplated scopes of different embodiments. Although method embodiments may be discussed below as being performed in a particular order, other method embodiments contemplate steps that are performed in any logical order.

Figure 2:
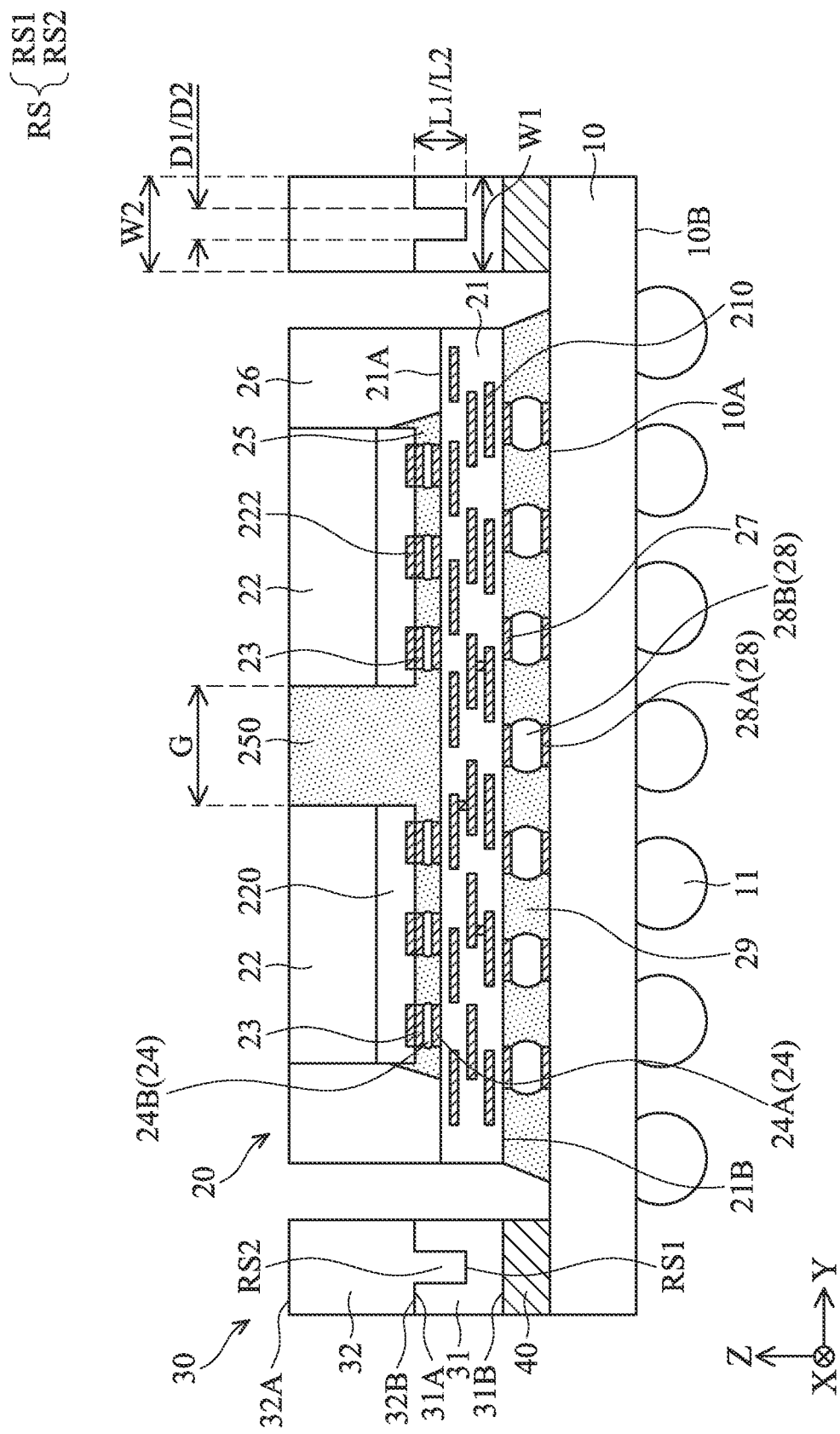
FIG. 2 is a schematic cross-sectional view of the semiconductor package taken along line A-A' in FIG. 1.

FIG. 1 is a schematic top view of a semiconductor package in accordance with some embodiments. FIG. 2 is a schematic cross-sectional view of the semiconductor package taken along line A-A' in FIG. 1. As shown in FIGS. 1 and 2, the semiconductor package includes a package substrate 10, a semiconductor device 20, a ring structure assembly 30, and an adhesive layer 40. Additional features can be added to the semiconductor package, and/or some of the features described below can be replaced or eliminated in other embodiments.

The package substrate 10 may be used to provide electrical connection between components or devices packaged in the semiconductor package and an external electronic device (not shown). In some embodiments, the package substrate 10 is a bulk semiconductor substrate, a semiconductor-on-insulator (SOI) substrate, a germanium-on-insulator (GOI) substrate, or the like. The semiconductor substrate is formed of a elementary semiconductor such as silicon or germanium; a compound semiconductor such as silicon germanium, silicon carbide, gallium arsenic, gallium phosphide, indium phosphide, indium arsenide, and/or indium antimonide; an alloy semiconductor such as SiGe, GaAsP, AlInAs, AlGaAs, GaInAs, GaInP, and/or GaInAsP; or combinations thereof. Alternatively, the package substrate 10 may include a printed circuit board (PCB), a ceramic substrate, or another suitable package substrate, in accordance with some other embodiments. The package substrate 10 may be a core or a core-less substrate.

In some embodiments, the package substrate 10 has various device elements (not shown). Examples of device elements that are formed in or on the package substrate 10 may include transistors (e.g., metal oxide semiconductor field effect transistors (MOSFET), complementary metal oxide semiconductor (CMOS) transistors, bipolar junction transistors (BJT), high voltage transistors, high-frequency transistors, p-passage and/or n-passage field-effect transistors (PFETs/NFETs), etc.), diodes, resistors, capacitors, inductors, and/or other applicable device elements. Various processes can be performed to form the device elements, such as deposition, etching, implantation, photolithography, annealing, and/or other suitable processes. The package substrate 10 may also have one or more circuit layers (not shown) used to electrically connect the device elements and semiconductor devices that are subsequently attached.

The package substrate 10 generally has a rectangular (or square) shape in a plan view (see FIG. 1), depending on design requirements, although other shapes may also be used. The package substrate 10 may have opposite surfaces 10A and 10B, which may be substantially parallel to each other. The surface 10A (the top surface shown) may be used to receive and bond other package components (which will be described in detail below) of the package. The surface 10B (the bottom surface shown) may have several electrical connectors 11 formed thereon to enable electrical connection between the entire package and an external electronic device such as a PCB (not shown). In some embodiments, the electrical connectors 11 may be or include solder balls such as tin-containing solder balls. The solder balls can be bonded to the package substrate 10 using a reflow process.

The semiconductor device 20 is disposed over the surface 10A of the package substrate 10. In some embodiments, the semiconductor device 20 is a package module, which includes an interposer 21 and a plurality of different types of semiconductor dies 22 and 22' (see FIG. 1) disposed over the interposer 21. For illustration, the semiconductor dies 22 herein are also referred to as first dies 22, and the semiconductor dies 22' herein are also referred to as second dies 22'. The semiconductor device 20 may also include one or more third dies (not shown) different from the first dies 22 and the second dies 22'.

In some embodiments, the first dies 22 include a logic die, which may be a Central Processing Unit (CPU) die, a Graphic Processing Unit (GPU) die, a mobile application die, a Micro Control Unit (MCU) die, an input-output (IO) die, a BaseBand (BB) die, an Application processor (AP) die, or the like. The first dies 22 may also include System-on-Chip (SOC) dies. In some embodiments, the second dies 22' include memory dies such as Dynamic Random Access Memory (DRAM) dies, Static Random Access Memory (SRAM) dies, High Bandwidth Memory (HBM) dies, or the like. The memory dies may be discrete memory dies, or may be in the form of a die stack that includes a plurality of stacked memory dies.

Each of the semiconductor dies 22 and 22' may include a semiconductor substrate 220 and a plurality of integrated circuit devices (not shown, including transistors, diodes, passive devices, etc.) formed on the semiconductor substrate 220. Also, several contact pads 222 interconnected to the internal circuits may be exposed at the respective active surface (the bottom surface shown) of the semiconductor dies 22 and 22', to which external electrical connections are made. Each semiconductor die 22/22' can be obtained, for example, by sawing or dicing a semiconductor wafer (with several IC dies formed thereon) along scribed lines to separate the semiconductor wafer into a plurality of individual semiconductor dies.

Depending on actual needs, the semiconductor dies 22 and 22' may have any suitable arrangement above the interposer 21, which will be described further later. The interposer 21 may include an organic interposer substrate, a silicon interposer substrate, or the like. The interposer 21 may also include conductive features 210 therein, such as conductive lines and conductive vias (sometimes collectively referred to as a redistribution line (RDL) structure), to interconnect contact pads (not shown) exposed at opposite surfaces 21A and 21B of the interposer 21. The materials and formation method of the interposer 21 are well known in the art and therefore not described herein.

In some embodiments, the semiconductor dies 22 and 22' may be bonded on the interposer 21 through flip-chip bonding (e.g., solder bonding) by way of conductive elements 23 on each semiconductor die 22/22' and conductive structures 24 on the interposer 21 to form conductive joints, as shown in FIG. 2. It should be appreciated that the embodiments described here are provided for illustrative purposes, and other suitable bonding methods can also be used in different embodiments.

In some embodiments, the conductive elements 23, such as conductive pillars, may be formed on the exposed contact pads 222 of the semiconductor dies 22/22' before the bonding process. The conductive elements 23 may be made of or include copper, aluminum, gold, cobalt, titanium, tin, one or more other suitable materials, or a combination thereof. The conductive elements 23 may be formed using an electroplating process, an electroless plating process, a placement process, a printing process, a physical vapor deposition (PVD) process, a chemical vapor deposition (CVD) process, one or more other applicable processes, or a combination thereof. In some alternative embodiments, the conductive elements 23 can be omitted.

In some embodiments, each of the conductive structures 24 includes a metal pillar 24A and a metal cap layer (such as a solder cap) 24B over the metal pillar 24A. The conductive structures 24 including the metal pillars 24A and the metal cap layers 24B are sometimes referred to as micro bumps. The conductive structures 24 may be formed on the surface 21A of the interposer 21 at the exposed contact pads (not shown) before the bonding process. The metal pillars 24A may include a conductive material such as copper, aluminum, gold, nickel, palladium, the like, or a combination thereof, and may be formed by sputtering, printing, electroplating, electroless plating, CVD, or the like. The metal pillars 24A may be solder-free and have substantially vertical sidewalls. The metal cap layers 24B may include nickel, tin, tin-lead, gold, copper, silver, palladium, indium, nickel-palladium-gold, nickel-gold, the like, or a combination thereof, and may be formed by a plating process such as an electroplating process. One of ordinary skill in the art would appreciate that the above conductive structures 24 examples are provided for illustrative purposes, and other structures of the conductive structures 24 may also be used.

In some embodiments, the semiconductor dies 22 and 22' are bonded to the interposer 21 through a reflow process. During the reflow, the conductive joints (including the conductive elements 23 and the conductive structures 24) are in contact with the exposed contact pads 222 of the semiconductor dies 22 and 22' and the exposed contact pads (constructed by some conductive features 210) of the interposer 21, respectively, to physically and electrically couple the semiconductor dies 22 and 22' to the interposer 21.

In some embodiments, an underfill element 25 is further formed over the interposer 21 to surround and protect the conductive joints, and enhances the connection between the semiconductor dies 22 and 22' and the interposer 21. The underfill element 25 may be made of or include an insulating material such as an underfill material. The underfill material may include an epoxy, a resin, a filler material, a stress release agent (SRA), an adhesion promoter, another suitable material, or a combination thereof. In some embodiments, an underfill material in liquid state is dispensed into the gap between each semiconductor die 22/22' and the interposer 21 (for example, by capillary effect) to reinforce the strength of the conductive joints and therefore the overall package structure. After the dispensing, the underfill material is cured to form the underfill element 25.

In some embodiments, the underfill element 25 fills the whole gap between each semiconductor die 22/22' and the interposer 21, and also has a portion 250 extending into a gap G between adjacent first dies 22, as shown in FIG. 2. The portion 250 exists but is not shown in FIG. 1.

In some embodiments, an encapsulant layer 26 is further formed over the interposer 21 to surround and protect the semiconductor dies 22 and 22' and the underfill element 25. In some embodiments, the encapsulant layer 26 is made of or includes an insulating material such as a molding material. The molding material may include a polymer material, such as an epoxy-based resin with fillers dispersed therein. In some embodiments, a molding material (such as a liquid molding material) is dispensed over the interposer 21 and/or over the semiconductor dies 22 and 22' such that the semiconductor dies 22 and 22' are buried or covered. In some embodiments, a thermal process is then used to cure the liquid molding material and to transform it into the encapsulant layer 26.

In some embodiments, a planarization process (not shown) is also performed on the encapsulant layer 26 to partially remove the encapsulant layer 26, until the backside (top surface) of each first die 22 is exposed through the top surface of the encapsulant layer 26, as shown in FIG. 2. This facilitates the dissipation of heat generated from the first dies 22 during operation (for example, in cases where the first dies 22 are high power-consuming dies). The planarization process may include a grinding process, a chemical mechanical polishing (CMP) process, an etching process, a dry polishing process, one or more other applicable processes, or a combination thereof.

In some embodiments, the semiconductor device 20 (including the interposer 21, the semiconductor dies 22 and 22', the underfill element 25, and the encapsulant layer 26, for example) may be bonded to the package substrate 10 through conductive elements 27 (such as conductive pillars) formed on the contact pads (not shown) exposed at the surface 21B (the bottom surface shown) of the interposer 21 and conductive structures 28 (such as micro bumps each including a metal pillar 28A and a metal cap layer 28B (such as a solder cap) over the metal pillar 28A) formed on the contact pads (not shown) exposed at the surface 10A of the package substrate 10, as shown in FIG. 2. The materials and formation method of the conductive elements 27 and the conductive structures 28 may be the same as or similar to those of the conductive elements 23 and the conductive structures 24 described above, and are not repeated herein.

In some embodiments, the semiconductor device 20 is bonded to the package substrate 10 through a reflow process. During the reflow, the conductive joints (including the conductive elements 27 and the conductive structures 28) are in contact with the exposed contact pads of the interposer 21 and the exposed contact pads of the package substrate 10, respectively, to physically and electrically connect the semiconductor device 20 to the package substrate 10.

In some embodiments, an underfill element 29 is also formed over the surface 10A of the package substrate 10 to surround and protect the conductive joints, and enhance the connection between the semiconductor device 20 and the package substrate 10. The materials and formation method of the underfill element 29 may be the same as or similar to those of the underfill element 25 described above, and are not repeated herein.

The ring structure assembly 30 is disposed over the surface 10A of the package substrate 10. The ring structure assembly 30 may have a rigidity greater than that of the package substrate 10, and may be configured as a stiffener ring for constraining the package substrate 10 to alleviate its warpage (due to stress generated during thermal cycling, which will be described further below) and/or to enhance the robustness of the package substrate 10. In some embodiments, the ring structure assembly 30 is arranged along the periphery of the package substrate 10 and surrounds the semiconductor device 20 above the package substrate 10. The ring structure assembly 30 may have a substantially rectangular or square ring shape in the plan view (see FIG. 1), depending on the shape of the package substrate 10.

In some embodiments, the ring structure assembly 30 is attached to the package substrate 10 using the adhesive layer 40 interposed between the bottom surface of the ring structure assembly 30 and the surface 10A of the package substrate 10. The adhesive layer 40 may be any suitable non-conductive adhesive, epoxy, die attach film (DAF), or the like, and may be applied to the bottom surface of the ring structure assembly 30 or may be applied over the surface 10A of the package substrate 10 before installing the ring structure assembly 30.

As shown in FIG. 2, the ring structure assembly 30 includes a lower ring 31 and an upper ring 32, in accordance with some embodiments. The upper ring 32 is disposed over (or stacked on) the lower ring 31, and the lower ring 31 is close to the surface 10A of the package substrate 10, when the ring structure assembly 30 is mounted on the package substrate 10.

In some embodiments, both the lower ring 31 and the upper ring 32 are ring structures that laterally surround the semiconductor device 20, and each ring structure has a uniform width W1 or W2. The width W1 of the lower ring 31 may be equal to the width W2 of the upper ring 32, but the disclosure is not limited thereto. In some other embodiments, one or both of the lower ring 31 and the upper ring 32 may have uneven widths (for example, the ring sides along a first horizontal direction (e.g., the X-direction shown in FIG. 1) may have a larger or smaller width than the ring sides along a second horizontal direction (e.g., the Y-direction shown in FIG. 1)), depending on design requirements.

In some embodiments, the lower ring 31 is a substantially flat structure with opposite surfaces 31A and 31B. The surface 31B (the bottom surface shown) of the lower ring 31 faces the surface 10A of the package substrate 10. The adhesive layer 40 is interposed between the surface 31B (i.e., the bottom surface of the ring structure assembly 30) and the surface 10A to attach the ring structure assembly 30 to the package substrate 10. Also, the upper ring 32 is a substantially flat structure with opposite surfaces 32A and 32B. The surface 32B (the bottom surface shown) of the upper ring 32 faces and is in direct contact with the surface 31A (the top surface shown) of the lower ring 31. In some embodiments, the surfaces 31A and 31B of the lower ring 31, the surfaces 32A and 32B of the upper ring 32, and the surface 10A of the package substrate 10 are parallel to each other.

In some embodiments, the lower ring 31 and the upper ring 32 are made of or include different materials. For example, the material of the lower ring 31 may be selected so that the coefficient of thermal expansion (CTE) of the lower ring 31 is similar to that of the underlying package substrate 10 to reduce CTE mismatch therebetween, thereby reducing stress (as well as deformation) on the package substrate 10 caused by the ring structure assembly 30. On the other hand, the material of the upper ring 32 may be selected so that its rigidity is greater than the stiffness of the lower ring 31 to increase the structural strength of the entire ring structure assembly 30. Accordingly, the warpage of the package substrate 10 can be better controlled. Examples of the material of the lower ring 31 and the upper ring 32 may include metals such as copper, stainless steel, stainless steel/Ni, and the like, but are not limited thereto.

In some embodiments, as shown in FIG. 2, the lower ring 31 further has recessed parts RS1 formed on the surface 31A that faces the upper ring 32, and the upper ring 32 further has protruding parts RS2 formed on the surface 32B that faces the lower ring 31 and corresponding to the recessed parts RS1, respectively. Each of the recessed parts RS1 may be vertically recessed from the surface 31A of the lower ring 31 into the inside of the lower ring 31, and each of the protruding parts RS2 may be vertically extending from the surface 32B of the upper ring 32 and into the respective recessed part RS1 of the lower ring 31.

Figure 3:
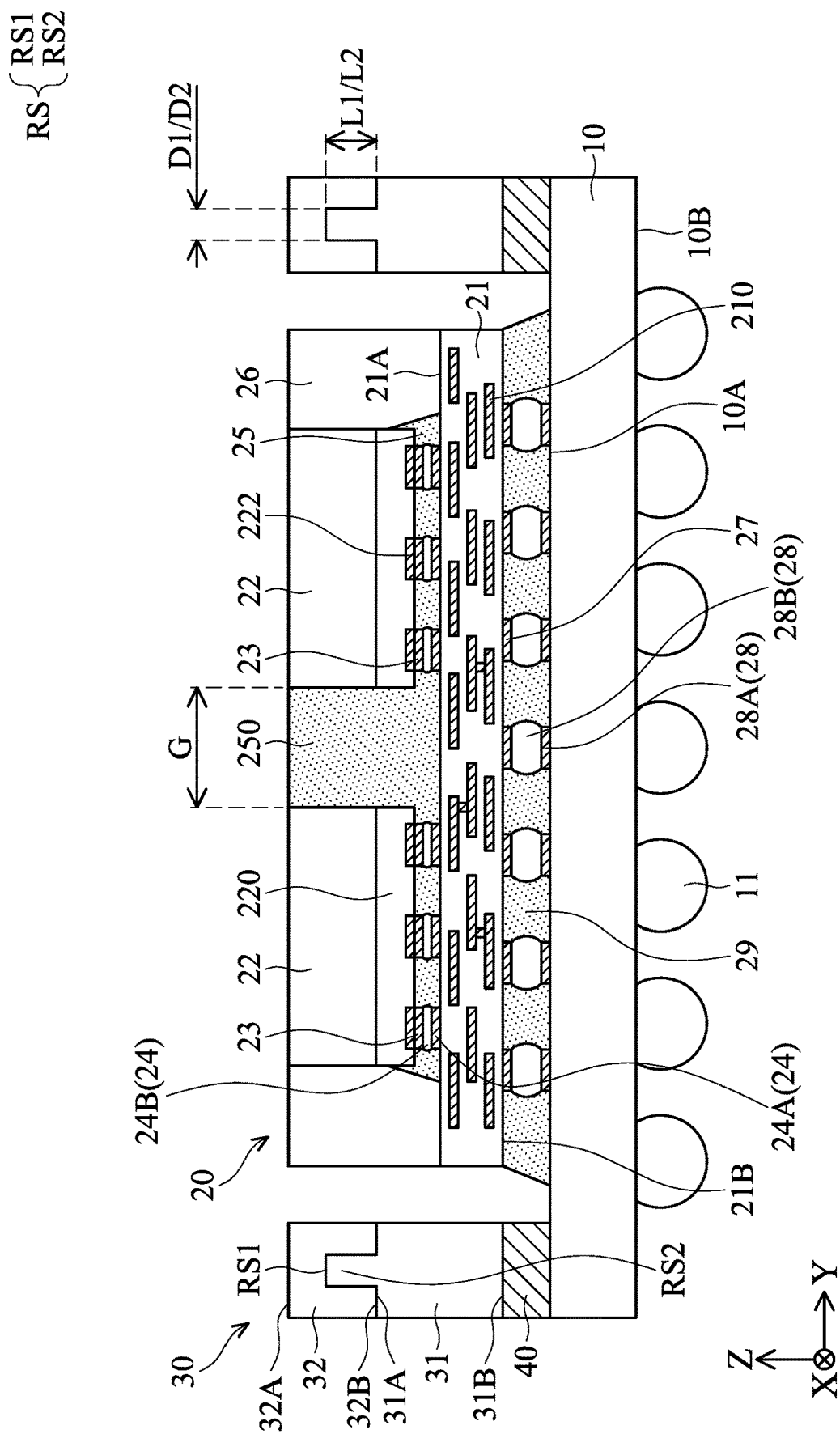
FIG. 3 is a schematic cross-sectional view of the semiconductor package taken along line A-A' in FIG. 1 in accordance with some other embodiments.

In some alternative embodiments, as shown in FIG. 3, the locations of the recessed parts RS1 and the protruding parts RS2 are interchanged, and the other features are the same as the embodiments shown in FIG. 2. Specifically, the recessed parts RS1 are formed on the surface 32B of the upper ring 32 that faces the lower ring 31, and the protruding parts RS2 are formed the surface 31A of the lower ring 31 that faces the upper ring 32.

Each protruding part RS2 and the respective recessed part RS1 have matching shapes and sizes in the vertical cross-sectional view, in accordance with some embodiments. For example, in FIGS. 2 and 3, the protruding part RS2 has a rectangular shape in the vertical cross-sectional view with a uniform width D2, and the recessed part RS1 has a rectangular receiving space (see FIG. 5B) in the vertical cross-sectional view with a uniform width D1, the width D1 being equal to or slightly larger than the width D2. Also, the depth L1 of the recessed part RS1 in the vertical direction (e.g., the Z-direction shown in FIG. 2 or 3) perpendicular to the surface 10A of the package substrate 10 is equal to or slightly greater than the thickness L2 of the protruding part RS2 in the vertical direction.

With the above design, the protruding parts RS2 engage with the recessed parts RS1, thereby connecting the lower ring 31 and the upper ring 32 together to form the ring structure assembly 30 (no additional adhesive layer is provided between the lower ring 31 and the upper ring 32). Since the combination of the recessed part RS1 and the corresponding protruding part RS2 can realize the function of assembling two flat rings, it is also referred to as a "riveting structure" RS in this disclosure.

In some embodiments, each riveting structure RS may have a horizontal cross-sectional shape (i.e., plan view shape) determined by the horizontal cross-sectional shape of the respective recessed part RS1 (which will be described further below). For example, in cases where the horizontal cross-sectional shape of the recessed parts RS1 is a circle, the riveting structures RS (or the protruding parts RS2) may have a circular horizontal cross-sectional shape, as shown in FIG. 1. The diameter of the circular riveting structure RS may be in the range between 1 mm and 7 mm, although other sizes can also be used. In some alternative embodiments, the riveting structures RS may also have other horizontal cross-sectional shapes, such as an ellipse, a quadrilateral, a triangle, or a hexagon as illustrated in FIGS. 4A-4D, or another suitable shape.

In some embodiments, as shown in FIG. 1, each riveting structure RS partially overlaps the ring structure assembly 30 (i.e., lower ring 31 and the upper ring 32) in the plan view. In other words, each riveting structure RS is not only disposed between the lower ring 31 and the upper ring 32, but also located within the boundary of the corresponding ring side of the ring structure assembly 30 in the plan view. In various embodiments, each riveting structure RS may be arranged in the center region of the ring structure assembly 30, equidistant (in a horizontal direction such as the X-direction or the Y-direction) from the inner and outer periphery of the ring structure assembly 30 (see FIG. 2 or 3), or may be arranged close to the inner or outer periphery of the ring structure assembly 30.

Next, the formation of the riveting structures RS and the assembly of the two rings (31, 32) shown in FIG. 2 or 3 are described with reference to FIGS. 5A-5C, in accordance with some embodiments. For simplicity, only one riveting structure RS is shown in these figures. In FIG. 5A, a flat first ring R1 and a flat second ring R2 are provided. In various embodiments, the first ring R1 may be used as the lower ring 31 and the second ring R2 may be used as the upper ring 32, or the first ring R1 may be used as the upper ring 32 and the second ring R2 may be used as the lower ring 31.

In FIG. 5B, a recessed part RS1 having vertical sidewalls is then formed on the surface S11 of the first ring R1 facing the second ring R2 (when the rings are separated) by a suitable process (not shown), including mechanical drilling, etching, or the like. The formed recessed part RS1 may have a sufficient depth L1 (i.e., the distance between the surface S11 and the bottom of the recessed part RS1) in the vertical direction (e.g., the Z-direction shown in FIG. 2 or 3) to facilitate subsequent stable engagement between the recessed part RS1 and the protruding part RS2, but the depth L1 is less than the thickness L3 of the first ring R1 (i.e., the distance between the surface S11 and the opposite surface S12 of the first ring R1) in the vertical direction, in some embodiments.

In FIG. 5C, the second ring R2 is then stacked on the first ring R1 with the surface S21 of the second ring R2 abutting the surface S11 of the first ring R1. Afterwards, an impact force (pressure, indicated by an arrow) may be applied to the surface S22 of the second ring R2 opposite to the surface S21, so that a portion (i.e., the protruding part RS2) of the second ring R2 is squeezed to extend from the surface S21 of the second ring R2 and into the corresponding recessed part RS1 formed on the surface S11 of the first ring R1. In such a way, the horizontal cross-sectional shape and size of the protruding part RS2 (or the riveting structure RS) match the horizontal cross-sectional shape and size of the corresponding recessed part RS1. The impact force can be released until the protruding part RS2 reaches (or almost reaches) the bottom of the recessed part RS1. As a result, each protruding part RS2 may be tightly fitted into (or engages with) the corresponding recessed part RS1, thereby connecting the first ring R1 and the second ring R2 together to form the ring structure assembly 30 described above with reference to FIG. 2 or 3. In some embodiments, as shown in FIG. 5C, the surface S22 of the second ring R2 may also have recesses, as illustrated by dashed lines, which recesses are formed due to the formation of the protruding parts RS2 on the opposite surface S21. Accordingly, recesses of the surface S22 may be located corresponding to recessed part RS1, and shapes of recesses of the surface S22 may be similar to shapes of the recessed part RS1 in top view. In some other embodiments, the final shapes of the first ring R1 and the second ring R2 may be formed by molding or other methods.

Many variations and/or modifications can be made to embodiments of the disclosure. For example, FIGS. 6A, 6B, 7A, and 7B illustrate riveting structures RS with different vertical cross-sectional shapes, in accordance with some other embodiments. For simplicity, only one riveting structure RS is shown in these figures. It should be understood that the difference between FIG. 6A and FIG. 6B and between FIG. 7A and FIG. 7B is that the locations of the recessed part RS1 and the protruding part RS2 are interchanged.

Figure 6A:
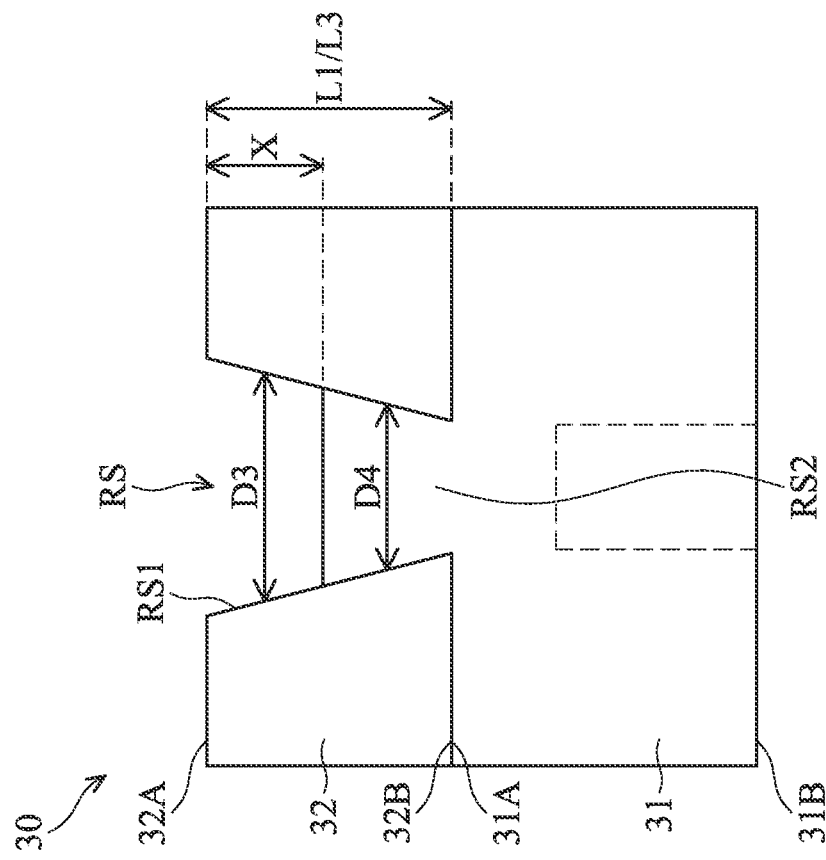
FIGS. 6A and 6B are schematic cross-sectional views of riveting structures in accordance with some other embodiments.
Figure 6B:
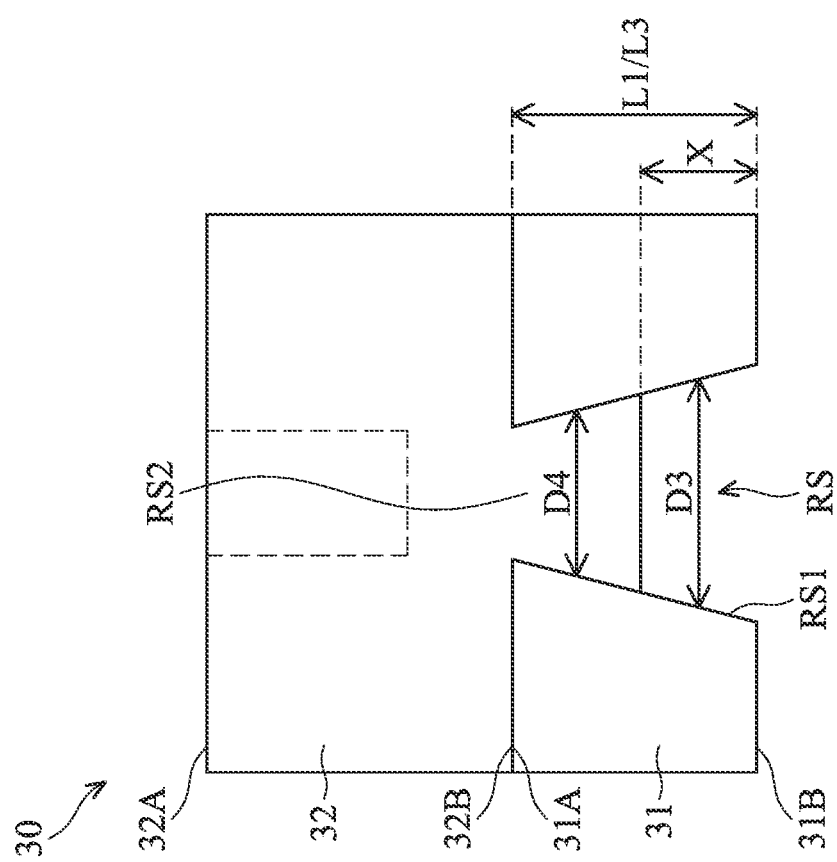
Figure 7B:
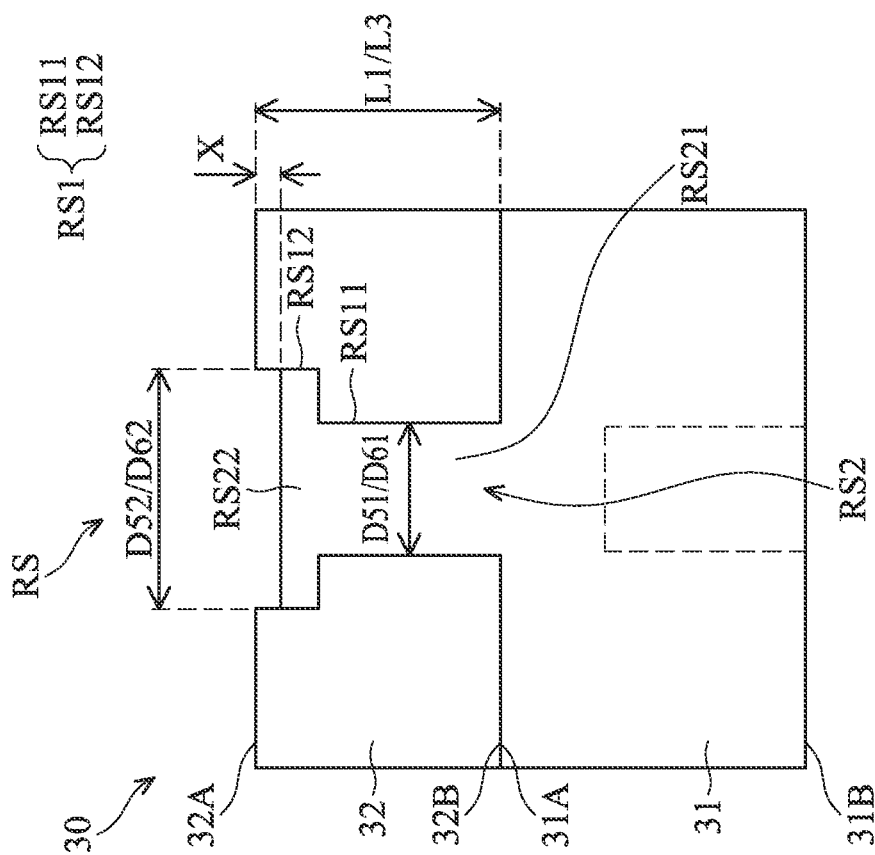
FIGS. 7A and 7B are schematic cross-sectional views of riveting structures in accordance with some other embodiments.
Figure 7A:
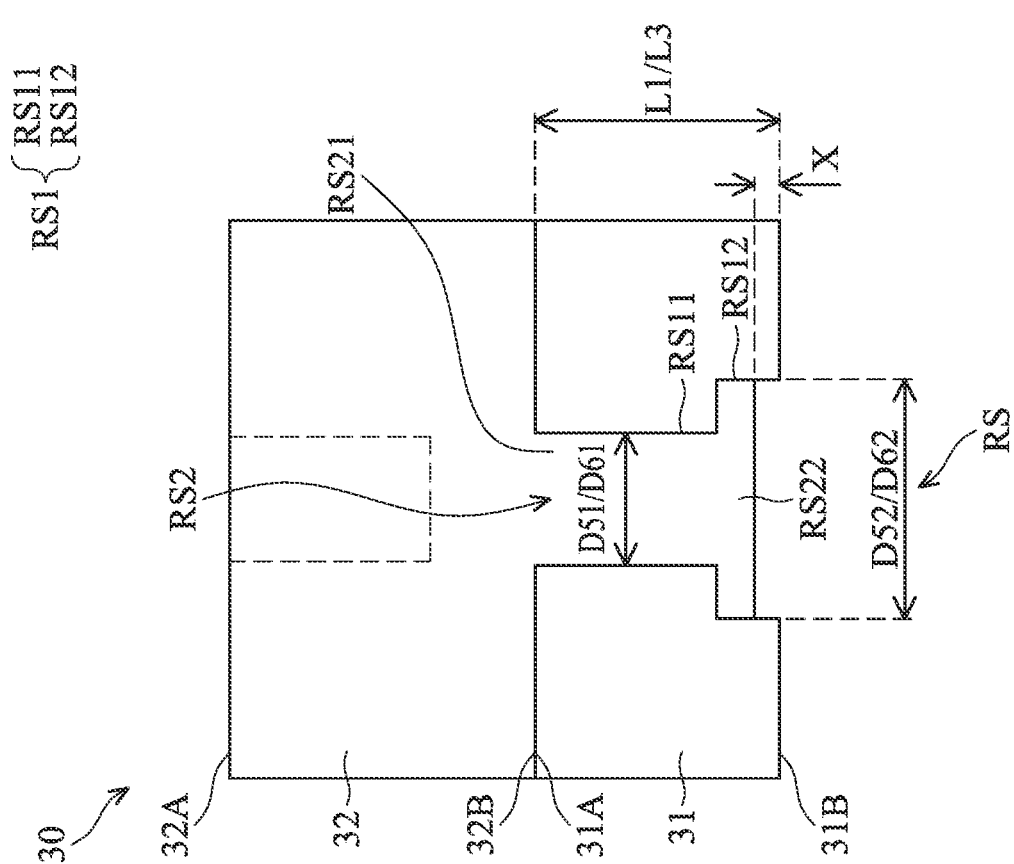

Referring to FIGS. 6A and 6B, the recessed part RS1 is formed on one of the lower ring 31 and the upper ring 32, and is formed through opposite surfaces (31A and 31B or 32A and 32B) of the ring. In other words, the depth L1 of the recessed part RS1 in the vertical direction (e.g., the Z-direction shown in FIG. 2 or 3) may be equal to the thickness L3 of the ring in the vertical direction. The formed recessed part RS1 may a trapezoidal receiving space (see FIG. 8B) in the vertical cross-sectional view with a gradually increasing width D3 (i.e., inclined sidewalls) in the vertical direction away from the other ring. Specifically, the portion of the recessed part RS1 immediately close to the other ring has the smallest width, and the portion of the recessed part RS1 farthest away from the other ring has the largest width. This helps to prevent the protruding part RS2 (formed on the other ring) from easily detaching from the recessed part RS1. Moreover, the protruding part RS2 extends from the (proximal) surface of the other ring facing the ring with the recessed part RS1 and into recessed part RS1. Correspondingly, the protruding part RS2 has a trapezoidal shape in the vertical cross-sectional view with a gradually increasing width D4 in the vertical direction away from the other ring. The width variation of the protruding part RS2 matches the width variation of the recessed part RS1.

Referring to FIGS. 7A and 7B, the recessed part RS1 is formed on one of the lower ring 31 and the upper ring 32, and is formed through opposite surfaces (31A and 31B or 32A and 32B) of the ring. In other words, the depth L1 of the recessed part RS1 in the vertical direction (e.g., the Z-direction shown in FIG. 2 or 3) may be equal to the thickness L3 of the ring in the vertical direction. The recessed part RS1 may include a first portion (receiving space, see FIG. 9B) RS11 and a second portion (receiving space, see FIG. 9B) RS12 with different widths (D51, D52) in the vertical cross-sectional view. The first portion RS11 is close to the other ring, and the second portion RS12 is away from the other ring. The width D52 of the second portion RS12 is larger than the width D51 of the first portion RS11. This helps to prevent the protruding part RS2 (formed on the other ring) from easily detaching from the recessed part RS1. In this embodiment, both the first portion RS11 and the second portion RS12 are rectangular, although other shape combinations can also be used. For example, in some other embodiments, the first portion RS11 may be rectangular and the second portion RS12 may be trapezoidal. Moreover, the protruding part RS2 extends from the (proximal) surface of the other ring facing the ring with the recessed part RS1 and into recessed part RS1. Correspondingly, the protruding part RS2 includes a first portion RS21 and a second portion RS22 with different widths (D61, D62) in the vertical cross-sectional view. The first portion RS21 is close to the (proximal) surface of the other ring, and the second portion RS22 is away from the (proximal) surface of the other ring. The width D62 of the second portion RS22 is larger than the width D61 of the first portion RS21. The width variation and shape of the protruding part RS2 match the width variation and shape of the recessed part RS1.

In some embodiments, as shown in FIGS. 6A, 6B, 7A, and 7B, the protruding part RS2 is received (or embedded) in the recessed part RS1, and there is a distance X (greater than 0) in the vertical direction between the end of protruding part RS2 and the (distal) surface of the ring away from the other ring.

In addition, the riveting structure RS (of FIG. 6A, 6B, 7A, or 7B) may be arranged in the center region of the ring structure assembly 30, equidistant (in the horizontal direction) from the inner and outer periphery of the ring structure assembly 30, or may be arranged close to the inner or outer periphery of the ring structure assembly 30, similar to the embodiments in FIGS. 2 and 3 described above.

Figure 8A:
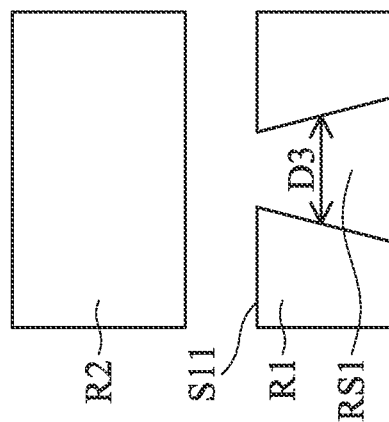
FIGS. 8A-8D illustrate cross-sectional views of various intermediate stages of the formation of the riveting structure and the assembly of the two rings shown in FIG. 6A or 6B, in accordance with some other embodiments.

Next, the formation of the riveting structure RS and the assembly of the two rings (31, 32) shown in FIG. 6A or 6B are described with reference to FIGS. 8A-8D, in accordance with some embodiments. In FIG. 8A, a flat first ring R1 and a flat second ring R2 are provided. In various embodiments, the first ring R1 may be used as the lower ring 31 and the second ring R2 may be used as the upper ring 32, or the first ring R1 may be used as the upper ring 32 and the second ring R2 may be used as the lower ring 31.

Figure 8B:
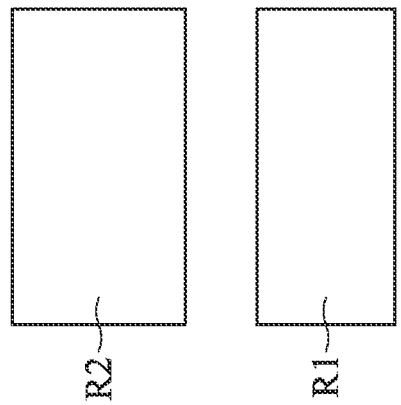

In FIG. 8B, a recessed part RS1 having inclined sidewalls is then formed in the first ring R1 (when the rings are separated) by a suitable process (not shown), including mechanical drilling, etching, or the like. The recessed part RS1 may pass through opposite surfaces S11 and S12 of the first ring R1, and may have a gradually varying width D3 as described above with reference to FIGS. 6A and 6B.

Figure 8C:
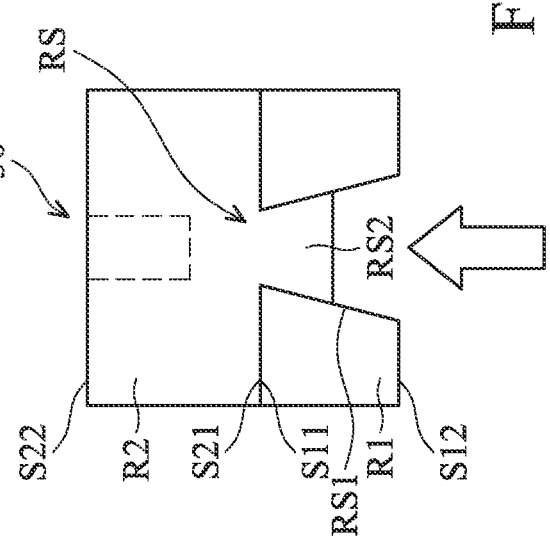

In FIG. 8C, the second ring R2 is then stacked on the first ring R1 with the surface S21 of the second ring R2 abutting the surface S11 of the first ring R1. Afterwards, an impact force (pressure, indicated by an arrow) is applied to the surface S22 of the second ring R2 opposite to the surface S21, so that a portion (i.e., the protruding part RS2) of the second ring R2 is squeezed to extend from the surface S21 of the second ring R2 and into the corresponding recessed part RS1 formed on the surface S11 of the first ring R1. In such a way, the horizontal cross-sectional shape and size of the protruding part RS2 match the horizontal cross-sectional shape and size of the portion of the corresponding recessed part RS1 immediately close to the second ring R2. The impact force can be released until a portion (e.g., end portion) of the protruding part RS2 extends beyond the surface S12 of the first ring R1 (see FIG. 8C). In some embodiments, as shown in FIG. 8C, the surface S22 of the second ring R2 may also have recesses, as illustrated by dashed lines, which recesses are formed due to the formation of the protruding parts RS2 on the opposite surface S21.

Figure 8D:
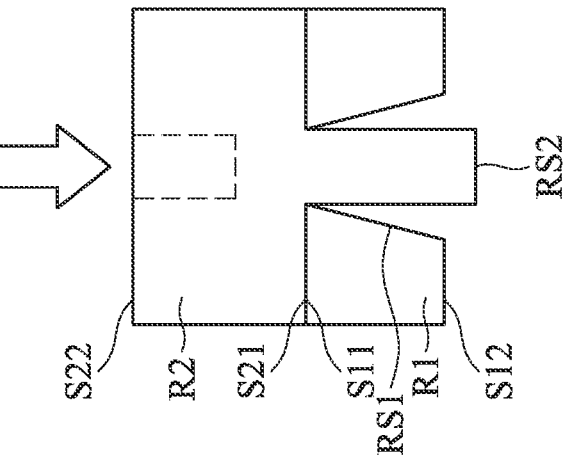

In FIG. 8D, another impact force (pressure, indicated by an arrow) is applied to the protruding part RS2 (while the second ring R2 remains fixed) from the surface S12 of the first ring R1, to press the end portion of the protruding part RS2 back into the recessed part RS1, thereby shaping the pressed protruding part RS2 into the same shape as the recessed part RS1.

As a result, each protruding part RS2 is tightly fitted into (or engages with) the corresponding recessed part RS1, thereby connecting the first ring R1 and the second ring R2 together to form the ring structure assembly 30 described above with reference to FIG. 6A or 6B.

Figure 9A:
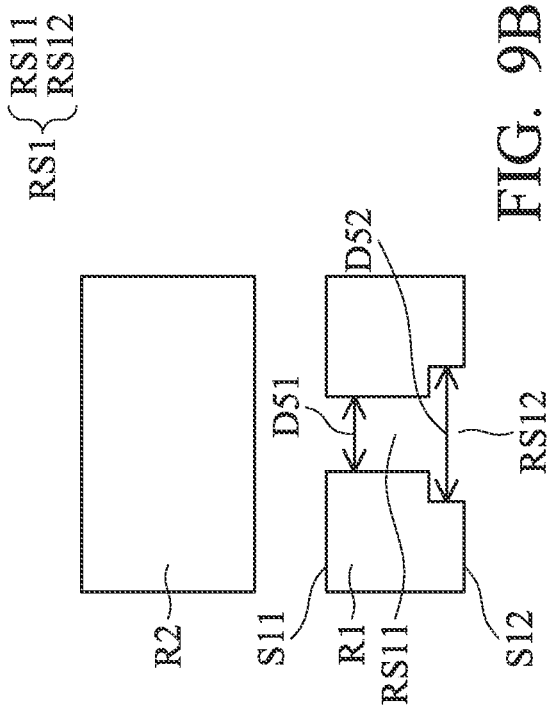
FIGS. 9A-9D illustrate cross-sectional views of various intermediate stages of the formation of the riveting structure and the assembly of the two rings shown in FIG. 7A or 7B, in accordance with some other embodiments.

The formation of the riveting structure RS and the assembly of the two rings (31, 32) shown in FIG. 7A or 7B are described with reference to FIGS. 9A-9D, in accordance with some embodiments. In FIG. 9A, a flat first ring R1 and a flat second ring R2 are provided. In various embodiments, the first ring R1 may be used as the lower ring 31 and the second ring R2 may be used as the upper ring 32, or the first ring R1 may be used as the upper ring 32 and the second ring R2 may be used as the lower ring 31.

Figure 9B:
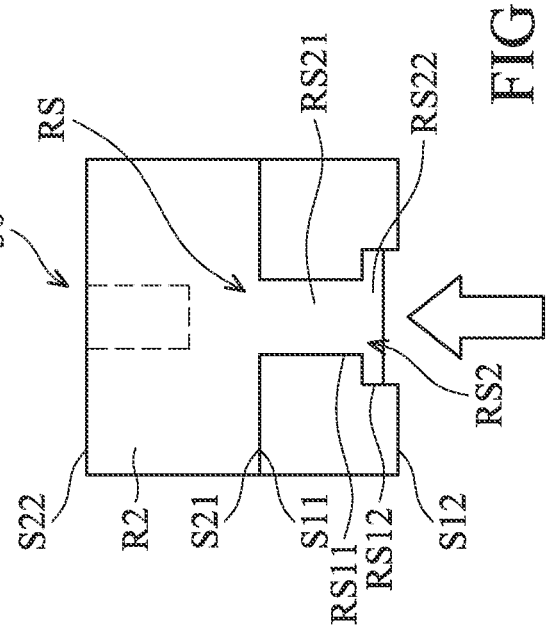

In FIG. 9B, a recessed part RS1 including a first portion RS11 and a second portion RS12 with different widths is then formed in the first ring R1 (when the rings are separated) by a suitable process (not shown), including mechanical drilling, etching, or the like. The recessed part RS1 may pass through opposite surfaces S11 and S12 of the first ring R1, and the width D52 of the second portion RS12 may be larger than the width D51 of the first portion RS11 as described above with reference to FIGS. 7A and 7B.

Figure 9C:
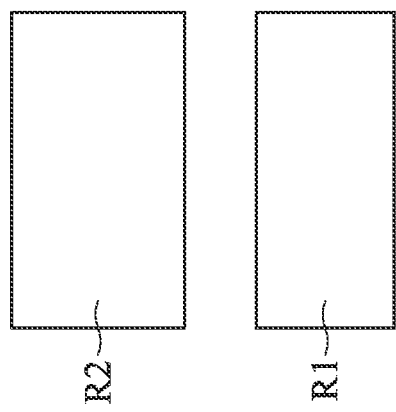

In FIG. 9C, the second ring R2 is then stacked on the first ring R1 with the surface S21 of the second ring R2 abutting the surface S11 of the first ring R1. Afterwards, an impact force (pressure, indicated by an arrow) is applied to the surface S22 of the second ring R2 opposite to the surface S21, so that a portion (i.e., the protruding part RS2) of the second ring R2 is squeezed to extend from the surface S21 of the second ring R2 and into the corresponding recessed part RS1 formed on the surface S11 of the first ring R1. In such a way, the horizontal cross-sectional shape and size of the protruding part RS2 match the horizontal cross-sectional shape and size of the portion (i.e., the first portion RS11) the corresponding recessed part RS1 immediately close to the second ring R2. The portion of the protruding part RS2 in the first portion RS11 of the recessed part RS1 forms the first portion RS21 of the protruding part RS2. The impact force can be released until a portion (e.g., end portion) of the protruding part RS2 extends beyond the surface S12 of the first ring R1 (see FIG. 9C). In some embodiments, as shown in FIG. 9C, the surface S22 of the second ring R2 may also have recesses, as illustrated by dashed lines, which recesses are formed due to the formation of the protruding parts RS2 on the opposite surface S21.

Figure 9D:
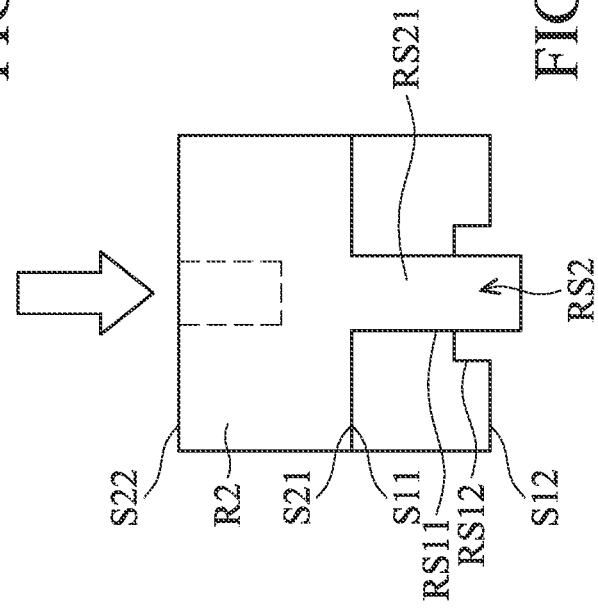

In FIG. 9D, another impact force (pressure, indicated by an arrow) is applied to the protruding part RS2 (while the second ring R2 remains fixed) from the surface S12 of the first ring R1, to press the end portion of the protruding part RS2 back into the recessed part RS1, thereby shaping the pressed protruding part RS2 into the same shape as the recessed part RS1 (the portion of the protruding part RS2 in the second portion RS12 of the recessed part RS1 forms the second portion RS22 of the protruding part RS2).

As a result, each protruding part RS2 is tightly fitted into (or engages with) the corresponding recessed part RS1, thereby connecting the first ring R1 and the second ring R2 together to form the ring structure assembly 30 described above with reference to FIG. 7A or 7B.

It should be understood that the geometries and the manufacturing methods described herein are only illustrative, and are not intended to be, and should not be constructed to be, limiting to the present disclosure. Many alternatives and modifications will be apparent to those skilled in the art, once informed by the present disclosure.

It should also be appreciated that various package components and substrate materials mentioned above that are used in the semiconductor package may have different CTEs. Hence, when the package undergoes thermal cycling during package assembly, reliability testing, or field operation, the package components and substrate materials may expand at different rates, causing the package substrate 10 tends to warp. The ring structure assembly 30 may reduce some extent this warpage, but since the ring structure assembly 30 constrains the package substrate 10, this constraining force also produces stress in the package substrate 10 and various package components thereon. As discussed above, since the lower ring 31 and the upper ring 32 of the ring structure assembly 30 can be directly connected by the above-mentioned riveting structures RS, no additional adhesive layer is required to connect the lower ring 31 and the upper ring 32. Thus, the risk of delamination of the adhesive layer between the rings during thermal cycling can be eliminated.

In addition, the riveting structures RS may also be arranged such that the stress in the package can be reduced or relieved.

Figure 10B:
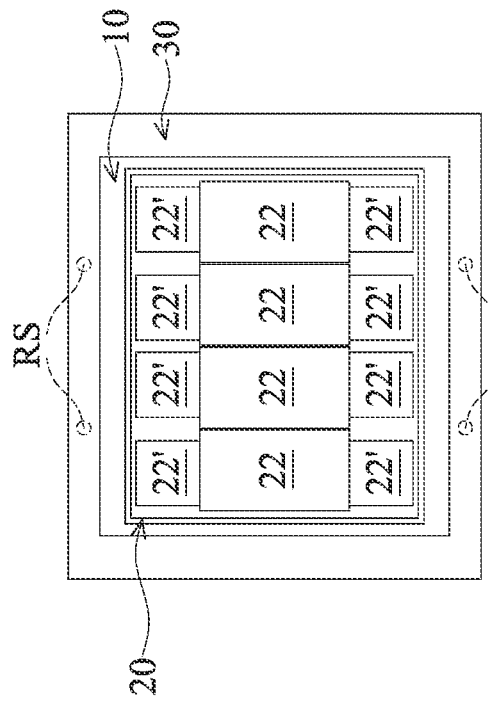
FIGS. 10A, 10B, 10C, and 10D are schematic top views of semiconductor packages in accordance with some other embodiments.
Figure 10D:
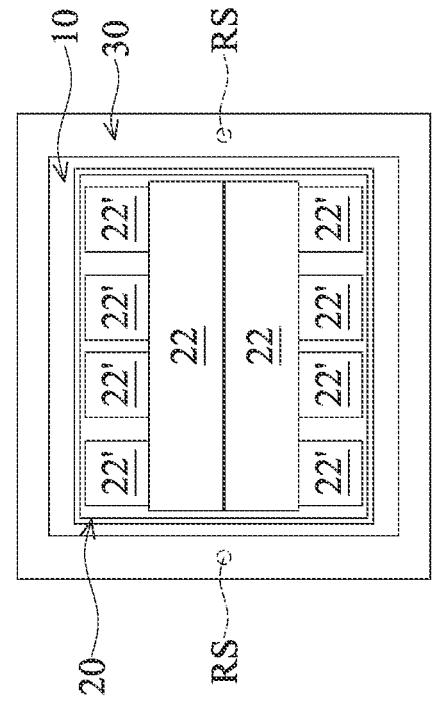
Figure 10A:
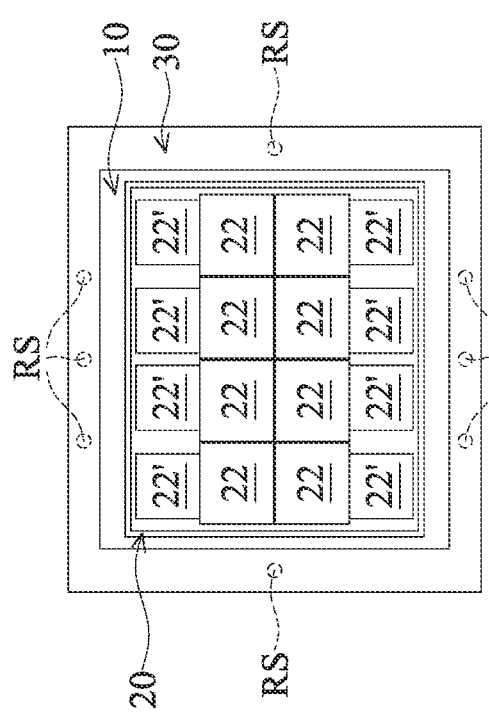
Figure 10C:
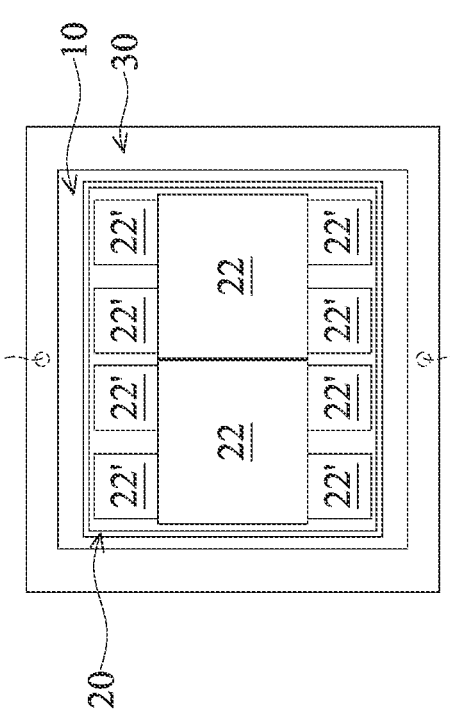
Figure 11A:
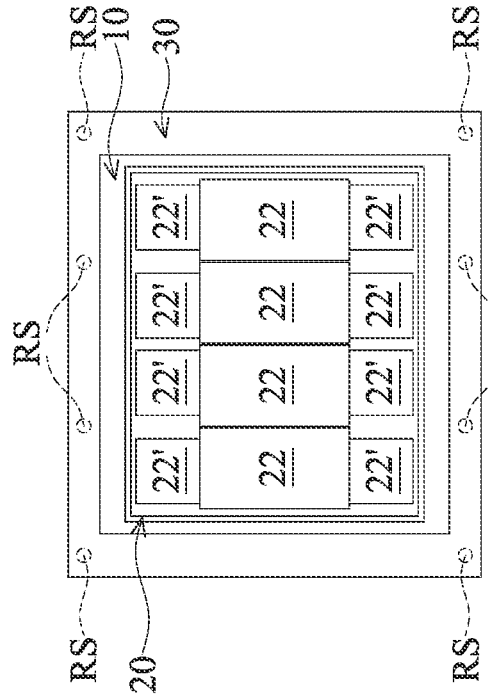
FIGS. 11A, 11B, 11C, and 11D are schematic top views of semiconductor packages in accordance with some other embodiments.
Figure 11B:
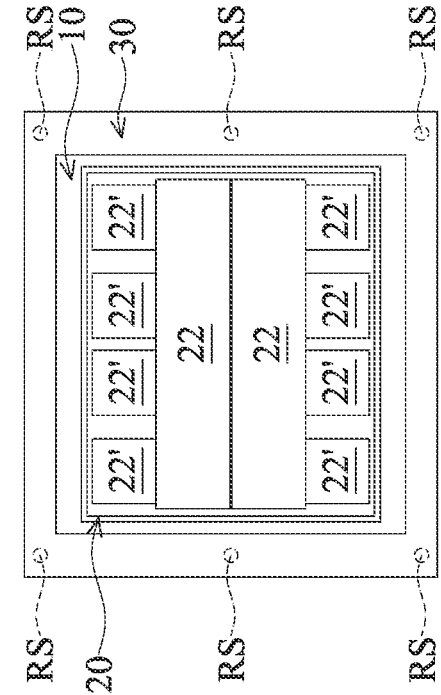
Figure 11C:
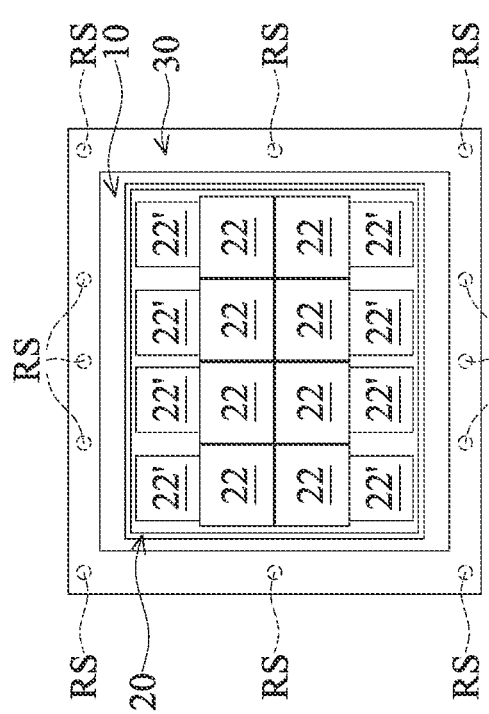
Figure 11D:
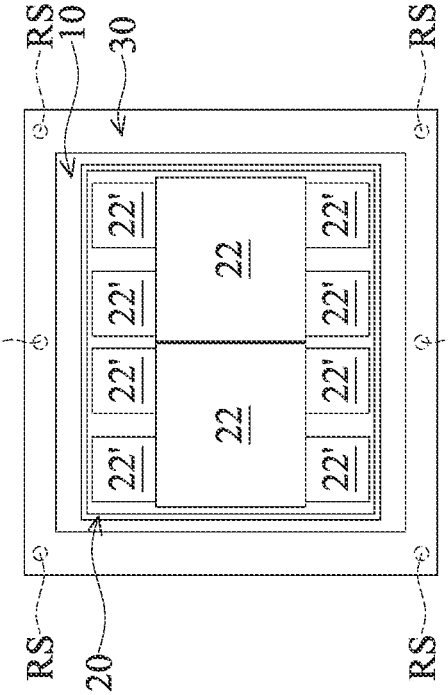

For example, referring to FIGS. 1 and 10A-10D, which illustrate schematic top views of various semiconductor packages in accordance with some embodiments. In FIGS. 1 and 10-10D, the first dies 22 may be arranged in a two-dimensional (2D) matrix (such as 1×2, 1×4, 2×1, 2×2, or 2×4) in the central area of the interposer 21 (see FIG. 2 or 3), and the second dies 22' may be arranged around the first dies 22. Other arrangements and other numbers of semiconductor dies 22 and 22' can also be used in different embodiments. Typically, the stress generated during thermal cycling may be concentrated in die-to-die areas of the package (for example, the small gaps G between adjacent first dies 22, as shown in FIG. 2 or 3), which will cause cracks to easily occur in the used underfill element(s)(such as the portion 250 of the underfill element 25) corresponding to these areas, thereby inducing the reliability issues. By arranging the riveting structures RS to correspond to the elongated, small gaps (high stress areas) between adjacent first dies 22 in the plan view, as shown in FIGS. 1 and 10A-10D, it helps to relieve the stress in the package and improve the reliability of the entire package structure. This is due to a reduction of the coupling effect between the ring structure assembly 30 and the package substrate 10 at the riveting structures RS.

In some embodiments, two riveting structures RS are arranged on opposite sides of each gap between adjacent first dies 22, and the two riveting structures RS and the corresponding gap are aligned in a (virtual) straight line in the plan view, as show in FIGS. 1 and 10A-10D, although there may also be only one riveting structure RS arranged on one side of each gap between adjacent first dies 22 and aligned with the corresponding gap in a (virtual) straight line in the plan view.

FIGS. 11A-11D illustrate schematic top views of various semiconductor packages in accordance with some other embodiments. Embodiments of FIGS. 11A-11D differ from embodiments of FIGS. 10A-10D in that additional riveting structures RS can be provided, and they can be arranged so that they correspond to the corners of the semiconductor device 20 (or the corners of the package substrate 10) in the plan view. This helps to further relieve the stress concentrated in the die corner areas of the package, thereby improving the reliability of the entire package structure. In some embodiments where the gap between adjacent first dies 22 is larger (the stress generated can be reduced), the riveting structures RS corresponding to the gaps can also be omitted.

In some alternative embodiments, some riveting structures RS may also be arranged in such a way that they correspond to the gaps between adjacent second dies 22' and/or the gaps between a first die 22 and an adjacent second die 22' (in cases where the gaps are small) in the plan view, to address the stress issue.

Figure 12B:
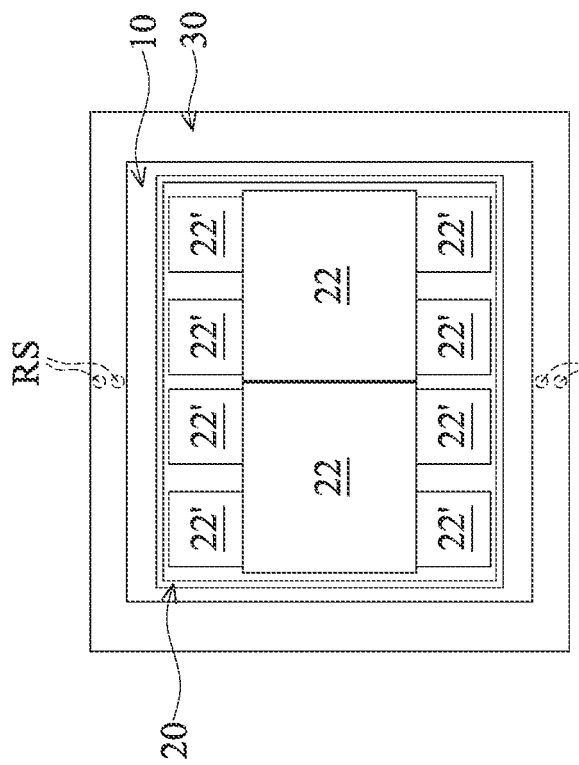
FIGS. 12A and 12B are schematic top views of semiconductor packages in accordance with some other embodiments.
Figure 12A:
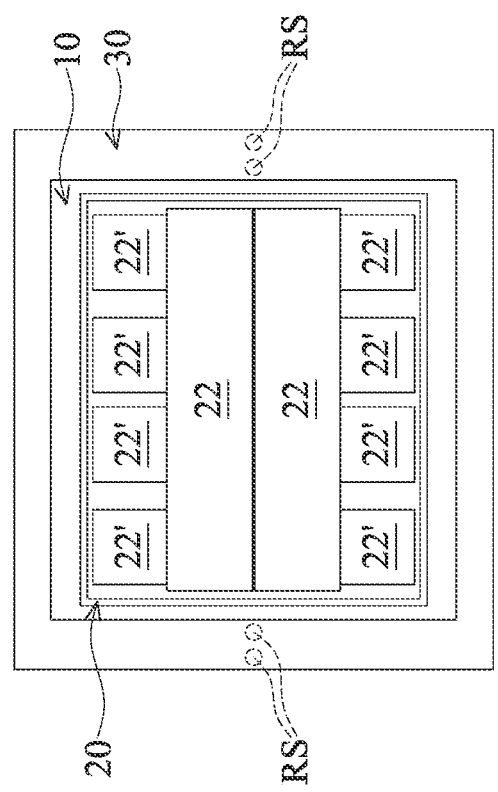

In some embodiments, as shown in FIGS. 12A and 12B, there are multiple (e.g., two) riveting structures RS arranged on the same side of the gap between adjacent first dies 22, and the riveting structures RS and the gap are aligned in a (virtual) straight line in the plan view. Compared with the use of a riveting structure RS (see FIGS. 10C and 10D), multiple riveting structures RS (or multiple row riveting structures RS) provided in the width direction of the ring structure assembly 30 can increase the connection strength between the lower ring 31 and the upper ring 32 of the ring structure assembly 30.

Figure 13:
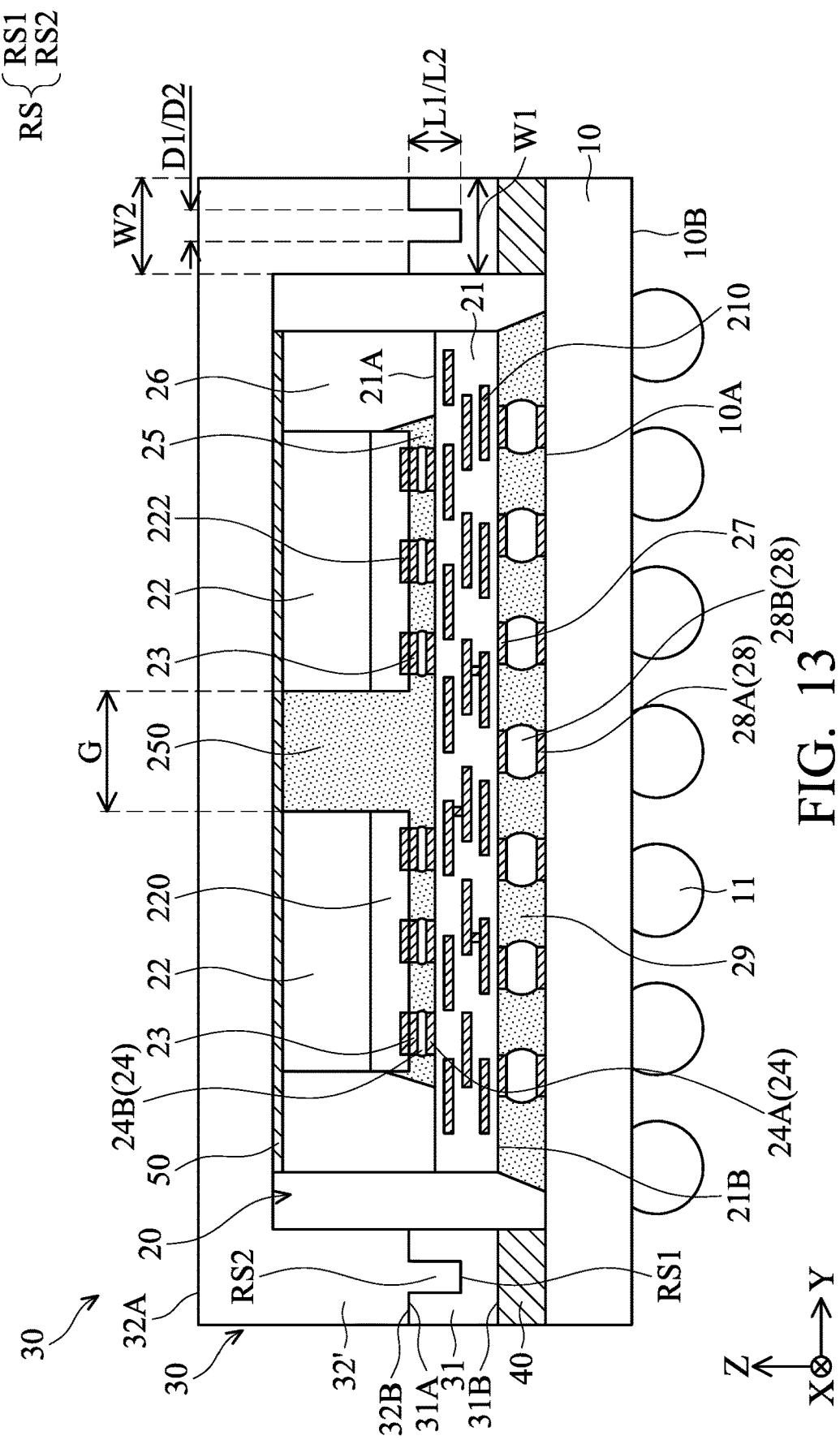
FIG. 13 illustrates that the upper ring is a lid structure in accordance with some other embodiments.

FIG. 13 is a schematic cross-sectional view of a semiconductor package in accordance with some other embodiments. Embodiments of FIG. 13 differ from embodiments of FIG. 2 in that the upper ring 32' is a lid structure (instead of a ring structure) that extends across and covers the top surface of the semiconductor device 20. As a lid structure, the upper ring 32' may have a high thermal conductivity (Tk), for example, between about 200 W/mK to about 400 W/mK or more, and may be configured as a heat spreader for dispersing heat generated from semiconductor device 20. The lid structure may be formed using a metal, a metal alloy, or the like. For example, the material of lid structure may include metals and/or metal alloys such as Al, Cu, Ni, Co, the like, or a combination thereof. In various embodiments, the lid structure (upper ring 32') is formed of a substantially similar material as the lower ring 31, or is formed of a different material from the lower ring 31. The upper ring 32' and the lower ring 31 can also be connected by the above-mentioned riveting structures RS (illustrated in FIGS. 1-12B) without an additional adhesive layer.

In some embodiments, as shown in FIG. 13, a thermal interface material (TIM) 50 is interposed between and in contact with the upper ring 32' and the top surface of the semiconductor device 20 to help heat dissipation of the semiconductor device 20. The thermal interface material 50 may be made of or include a high thermal conductivity material such as a metallic-based material or a solder-based material comprising Cu, Ag, indium paste, or the like. In some other embodiments, the thermal interface material 50 is omitted, and the upper ring 32' abuts on the top surface of the semiconductor device 20.

It is appreciated that although in the example embodiments described above, a package module is described as an example of the semiconductor device 20, the semiconductor device 20 may also be of other types (for example, a single semiconductor chip or die).

Figure 14:
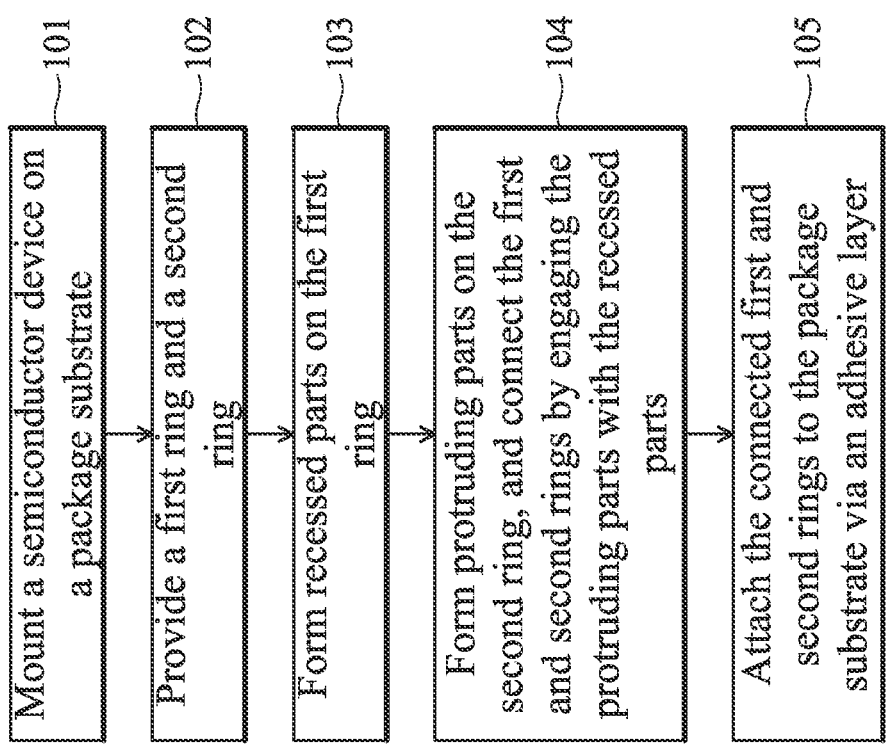
FIG. 14 is a simplified flowchart illustrating a method for forming a semiconductor package in accordance with some embodiments.

FIG. 14 is a simplified flowchart illustrating a method for forming a semiconductor package (such as the semiconductor packages shown in FIGS. 1-3 and 10A-13) in accordance with some embodiments. In operation 101, the semiconductor device 20 is mounted on the package substrate 10, as shown in FIG. 2. In operation 102, a first ring R1 and a second ring R2 are provided, as shown in FIG. 5A, 8A, or 9A. In operation 103, recessed parts RS1 are formed on the first ring R1, as shown in FIG. 5B, 8B, or 9B. In operation 104, protruding parts RS2 are formed on the second ring R2, and then the first ring R1 and the second ring R2 are connected together to form the ring structure assembly 30 (including connected lower ring 31 and upper ring 32) by engaging the protruding parts RS2 with the recessed parts RS1, as shown in FIG. 5C, 8D, or 9D. Since the lower ring 31 and the upper ring 32 can be directly connected by the riveting structures RS (including matching protruding parts RS2 and recessed parts RS1), the manufacturing process of the semiconductor package can be simplified (because the step of providing an adhesive layer for connecting the lower ring 31 and the upper ring 32 can be omitted). In operation 105, the ring structure assembly 30 is attached to the package substrate 10 via the adhesive layer 40 interposed between the bottom surface of the lower ring 31 and the top surface 10A of the package substrate 10, as shown in FIG. 2.

The embodiments of the present disclosure have some advantageous features. By using riveting structures to connect rings (or a ring and a lid), it eliminates the risk of delamination of the adhesive layer between the rings during thermal cycling. Also, the manufacturing process of the semiconductor package can be simplified. Moreover, by arranging the riveting structures to correspond to the high stress areas (such as die-to-die areas and/or die corner areas) in the semiconductor package, it also helps to relieve the stress in the package, thereby improving the reliability of the entire package.

In accordance with some embodiments, a semiconductor package is provided. The semiconductor package includes a package substrate, a semiconductor device, a first ring, a second ring, and an adhesive layer. The semiconductor device is mounted on the surface of the package substrate. The first ring is disposed over the surface of the package substrate and surrounds the semiconductor device. The first ring has a bottom surface facing the surface of the package substrate and a top surface opposite the bottom surface of the first ring. The second ring is disposed over the top surface of the first ring. The second ring has a bottom surface facing the top surface of the first ring and a top surface opposite the bottom surface of the second ring. Moreover, a protruding part extends from one of the top surface of the first ring and the bottom surface of the second ring, and a recessed part is recessed from the other of the top surface of the first ring and the bottom surface of the second ring. The protruding part extends into and engages with the recessed part. The adhesive layer is disposed between the surface of the package substrate and the bottom surface of the first ring.

In accordance with some embodiments, a semiconductor package is provided. The semiconductor package includes a package substrate, a semiconductor device, a first ring, a second ring, and an adhesive layer. The semiconductor device is mounted on the surface of the package substrate. The first ring is disposed over the surface of the package substrate and surrounds the semiconductor device. The second ring is stacked on the first ring with the bottom surface of the second ring facing the top surface of the first ring. Moreover, multiple riveting structures are arranged between the first ring and the second ring and spaced apart from each other. Each riveting structure includes a protruding part formed on one of the top surface of the first ring and the bottom surface of the second ring, and a recessed part formed on the other of the top surface of the first ring and the bottom surface of the second ring. The protruding part is fitted into the recessed part. The adhesive layer is disposed between the surface of the package substrate and the bottom surface of the first ring.

In accordance with some embodiments, a method for forming a semiconductor package is provided. The method includes mounting a semiconductor device on a surface of a package substrate. The method also includes providing a first ring having a first surface and a second ring having a second surface facing the first surface of the first ring. The method also includes forming at least one recessed part on the first surface of the first ring. The method further includes forming at least one protruding part on the second surface of the second ring, and connecting the first ring and the second ring together by engaging the protruding part with the recessed part. In addition, the method includes attaching the first ring and the second ring to the surface of the package substrate via an adhesive layer formed between the package substrate and one of the first ring and the second ring.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
    a package substrate;
    a semiconductor device mounted on a surface of the package substrate;
    a first ring disposed over the surface of the package substrate and surrounding the semiconductor device, wherein the first ring has a bottom surface facing the surface of the package substrate and a top surface opposite the bottom surface of the first ring;
    a second ring disposed over the top surface of the first ring, wherein the second ring has a bottom surface facing the top surface of the first ring and a top surface opposite the bottom surface of the second ring, and wherein a protruding part extends from one of the top surface of the first ring and the bottom surface of the second ring, and a recessed part is recessed from the other of the top surface of the first ring and the bottom surface of the second ring, wherein an opposite surface of the one of the top surface of the first ring and the bottom surface of the second ring having the protruding part has a recess aligned with the protruding part, wherein the protruding part extends into and engages with the recessed part; and
    an adhesive layer disposed between the surface of the package substrate and the bottom surface of the first ring.

2. The semiconductor package as claimed in claim 1, wherein the top surface of the first ring is in direct contact with the bottom surface of the second ring, and there is no adhesive layer provided between the first ring and the second ring.

3. The semiconductor package as claimed in claim 1, wherein the first ring comprises a first material, and the second ring comprises a second material different from the first material.

4. The semiconductor package as claimed in claim 1, wherein the protruding part and the recessed part have matching shapes and sizes in a vertical cross-sectional view.

5. The semiconductor package as claimed in claim 4, wherein the protruding part has a rectangular shape in the vertical cross-sectional view with a uniform width.

6. The semiconductor package as claimed in claim 4, wherein the protruding part has a first portion and a second portion with different widths in the vertical cross-sectional view, the first portion being closer to the top surface of the first ring or the bottom surface of the second ring than the second portion, the second portion having a larger width than the first portion.

7. The semiconductor package as claimed in claim 1, wherein a depth of the recessed part in a vertical direction perpendicular to the surface of the package substrate is greater than or equal to a thickness of the protruding part in the vertical direction.

8. The semiconductor package as claimed in claim 7, wherein in the vertical direction, the depth of the recessed part is less than or equal to a thickness of the first ring or the second ring having the recessed part, and wherein the recessed part is formed through the top surface and the bottom surface of the respective first ring or the respective second ring in cases where the depth of the recessed part is equal to the thickness of the respective first ring or the respective second ring.

9. The semiconductor package as claimed in claim 1, wherein both the first ring and the second ring are ring structures that laterally surround the semiconductor device.

10. The semiconductor package as claimed in claim 1, wherein the first ring is a ring structure that laterally surrounds the semiconductor device, and the second ring is a lid structure that extends across and covers a top surface of the semiconductor device.

11. A semiconductor package, comprising:
a package substrate;
a semiconductor device mounted on a surface of the package substrate;
a first ring disposed over the surface of the package substrate and surrounding the semiconductor device;
a second ring stacked on the first ring with a bottom surface of the second ring facing a top surface of the first ring, wherein a plurality of riveting structures is arranged between the first ring and the second ring and spaced apart from each other, each of the plurality of riveting structures comprising:
a protruding part extending from one of the top surface of the first ring and the bottom surface of the second ring; and
a recessed part extending from the other of the top surface of the first ring and the bottom surface of the second ring, wherein the recessed part extends completely through one of the first ring and the second ring, wherein the protruding part is fitted into the recessed part; and
an adhesive layer disposed between the surface of the package substrate and a bottom surface of the first ring.

12. The semiconductor package as claimed in claim 11, wherein the semiconductor device comprises two dies arranged side by side, and a gap, which is elongated, is formed between the two dies, and wherein one or more of the plurality of riveting structures are arranged corresponding to the gap in a plan view.

13. The semiconductor package as claimed in claim 12, wherein two riveting structures of the plurality of riveting structures are arranged on opposite sides of the gap, and the two riveting structures and the gap are aligned in a straight line in the plan view.

14. The semiconductor package as claimed in claim 12, wherein two riveting structures of the plurality of riveting structures are arranged on a same side of the gap, and the two riveting structures and the gap are aligned in a straight line in the plan view.

15. The semiconductor package as claimed in claim 11, wherein the semiconductor device has corners, and some of the plurality of riveting structures are arranged corresponding to the corners of the semiconductor device in a plan view.

16. A method for forming a semiconductor package, comprising:
mounting a semiconductor device on a surface of a package substrate;
providing a first ring having a first surface and a second ring having a second surface facing the first surface of the first ring;
forming at least one recessed part on the first surface of the first ring;
forming at least one protruding part on the second surface of the second ring, and connecting the first ring and the second ring together by engaging the at least one protruding part with the at least one recessed part, wherein the forming the at least one protruding part and the connecting are performed simultaneously by imparting an impact force on a third surface of the second ring, wherein the third surface is an opposite surface of the second ring from the second surface of the second ring; and
attaching the first ring and the second ring to the surface of the package substrate via an adhesive layer formed between the package substrate and one of the first ring and the second ring.

17. The method as claimed in claim 16, wherein the first surface of the first ring, the second surface of the second ring, and the surface of the package substrate are parallel to each other.

18. The method as claimed in claim 16, wherein the at least one recessed part is formed through the first surface of the first ring and a fourth surface of the first ring opposite the first surface, and the at least one protruding part is inserted into the at least one recessed part from the first surface and has a portion extending beyond the fourth surface, and wherein the method further comprises:
applying another impact to the at least one protruding part from the fourth surface of the first ring, while the second ring remains fixed, to press the portion of the at least one protruding part back into the at least one recessed part, thereby engaging the at least one protruding part with the at least one recessed part.

19. The method as claimed in claim 16, wherein the first ring and the second ring comprise different materials.

20. The method as claimed in claim 16, wherein imparting the impact force forms a recess in the third surface.

* * * * *